United States Patent
Hsu et al.

(10) Patent No.: US 11,508,425 B2
(45) Date of Patent: Nov. 22, 2022

(54) MEMORY CELL ARRAY OF PROGRAMMABLE NON-VOLATILE MEMORY

(71) Applicant: eMemory Technology Inc., Hsin-Chu (TW)

(72) Inventors: Chia-Jung Hsu, Hsinchu County (TW); Wein-Town Sun, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 167 days.

(21) Appl. No.: 17/170,946

(22) Filed: Feb. 9, 2021

(65) Prior Publication Data

US 2021/0391434 A1 Dec. 16, 2021

Related U.S. Application Data

(60) Provisional application No. 63/038,895, filed on Jun. 14, 2020.

(51) Int. Cl.
*H01L 27/11519* (2017.01)
*H01L 27/11521* (2017.01)
*H01L 27/11524* (2017.01)
*H01L 29/423* (2006.01)
*G11C 11/16* (2006.01)
*G11C 13/00* (2006.01)
*G11C 16/04* (2006.01)
*G11C 16/08* (2006.01)
(Continued)

(52) U.S. Cl.
CPC ...... *G11C 11/1675* (2013.01); *G11C 11/1697* (2013.01); *G11C 13/0038* (2013.01); *G11C 13/0069* (2013.01); *G11C 16/0433* (2013.01); *G11C 16/08* (2013.01); *G11C 16/14* (2013.01); *G11C 16/24* (2013.01); *G11C 16/26* (2013.01); *G11C 16/30* (2013.01); *H01L 27/11519* (2013.01); *H01L 27/11521* (2013.01); *H01L 27/11524* (2013.01); *H01L 29/42328* (2013.01)

(58) Field of Classification Search
CPC ............ G11C 11/1675; G11C 11/1697; G11C 13/0038; G11C 13/0069; G11C 16/0433; G11C 16/08; G11C 16/14; G11C 16/24; G11C 16/26; G11C 16/30; G11C 2216/10; G11C 16/3409; G11C 16/10; H01L 27/11519; H01L 27/11521; H01L 27/11524; H01L 29/42328; H01L 27/1157; H01L 27/11575; H01L 27/11578
See application file for complete search history.

(56) References Cited

U.S. PATENT DOCUMENTS 8,941,167 B2 1/2015 Chen et al.
2020/0091168 A1* 3/2020 Hsu .................. H03K 3/037
2020/0365722 A1 11/2020 Hsu et al.

* cited by examiner

*Primary Examiner* — David Vu
(74) *Attorney, Agent, or Firm* — WPAT, PC

(57) ABSTRACT

A memory cell of a memory cell array includes a well region, a first doped region, a second doped region, a first gate structure, and a storage structure. The first doped region and the second doped region are formed in the well region. The first gate structure is formed over a first surface between the first doped region and the second doped region. The storage structure is formed over a second surface and the second surface is between the first surface and the second doped region. The storage structure is covered on a portion of the first gate structure, the second surface and an isolation structure.

15 Claims, 5 Drawing Sheets

(51) Int. Cl.
*G11C 16/14* (2006.01)
*G11C 16/24* (2006.01)
*G11C 16/26* (2006.01)
*G11C 16/30* (2006.01)

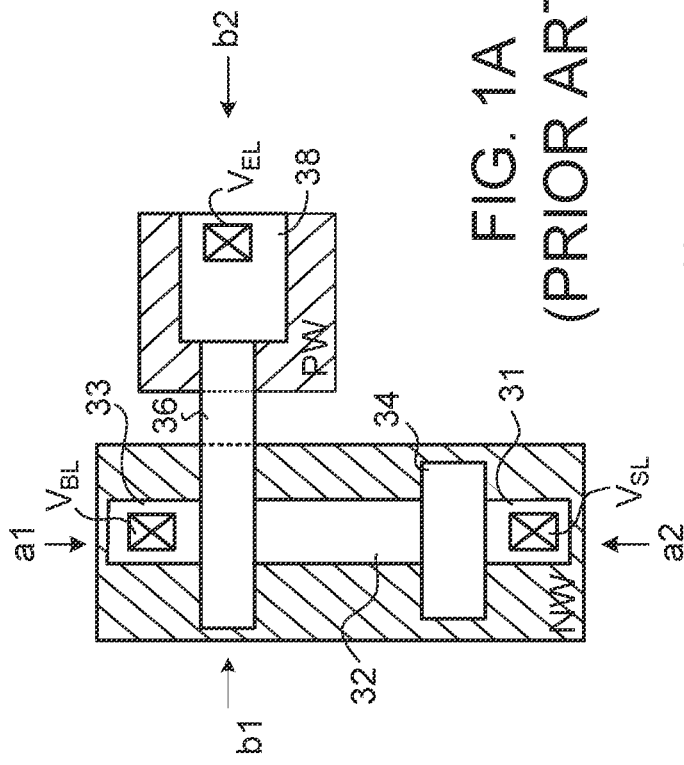
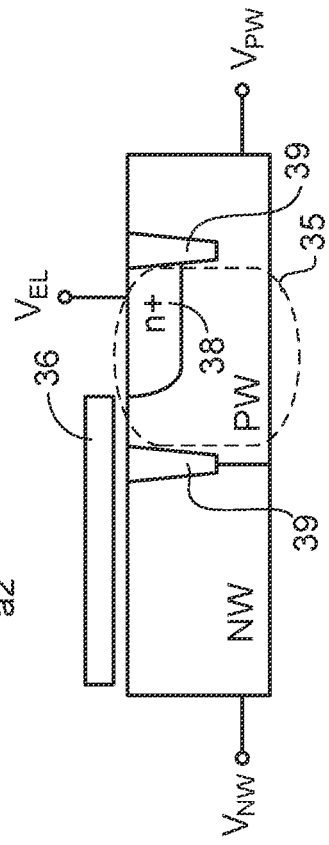
FIG. 1A (PRIOR ART)
FIG. 1C (PRIOR ART)
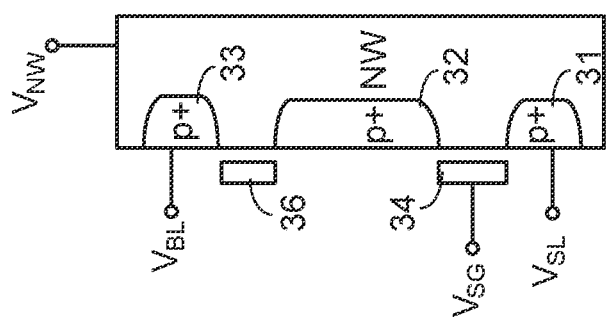
FIG. 1B (PRIOR ART)

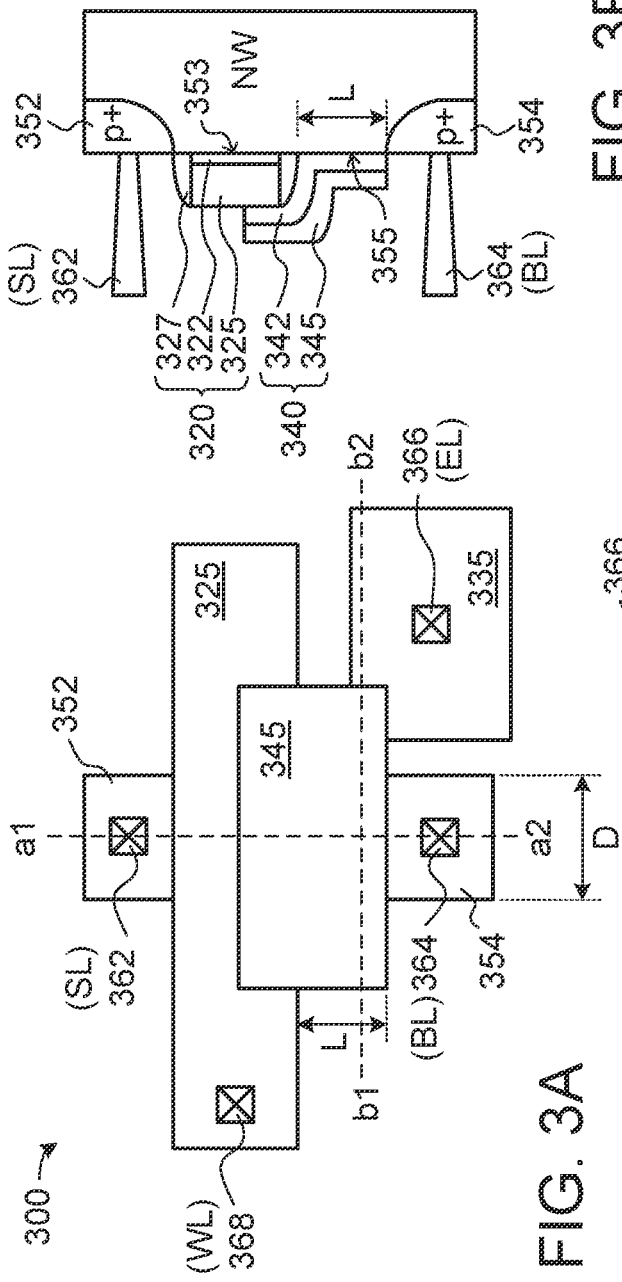
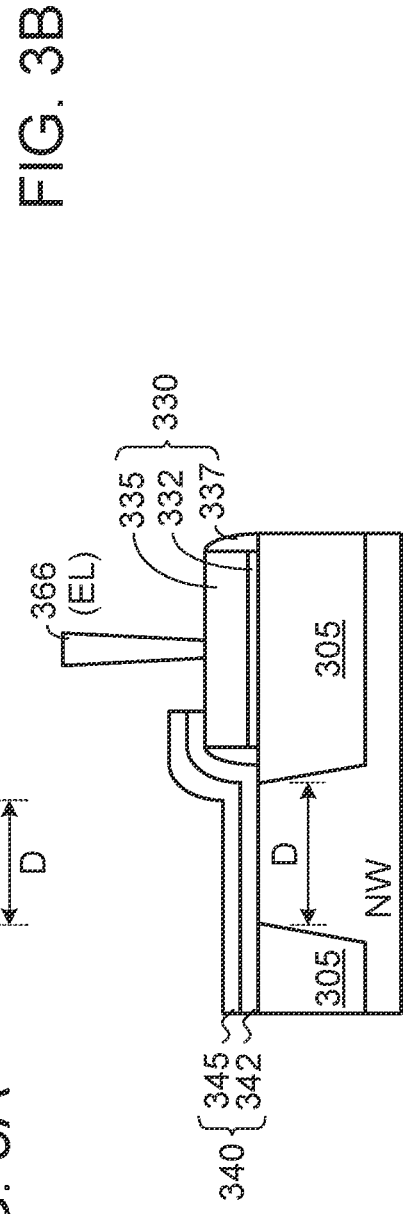

MEMORY CELL ARRAY OF PROGRAMMABLE NON-VOLATILE MEMORY

This application claims the benefit of U.S. provisional application Ser. No. 63/038,895, filed Jun. 14, 2020, the subject matter of which is incorporated herein by reference.

FIELD OF THE INVENTION

The present invention relates to a memory cell array of a non-volatile memory, and more particularly to a memory cell array of a programmable non-volatile memory.

BACKGROUND OF THE INVENTION

FIGS. 1A, 1B and 1C schematically illustrate the structure of a memory cell of a conventional erasable programmable non-volatile memory. For example, the conventional erasable programmable non-volatile memory is disclosed in U.S. Pat. No. 8,941,167.

FIG. 1A is a schematic top view illustrating a memory cell of a conventional non-volatile memory. FIG. 1B is a schematic cross-sectional view illustrating the memory as shown in FIG. 1A and taken along a first direction (a1-a2). FIG. 1C is a schematic cross-sectional view illustrating the memory cell as shown in FIG. 1A and taken along a second direction (b1-b2).

As shown in FIGS. 1A and 1B, the memory cell of the conventional non-volatile memory comprises two serially-connected p-type transistors. These two p-type transistors are constructed in an n-well region (NW). Three p-type doped regions 31, 32 and 33 are formed in the n-well region (NW). In addition, two polysilicon gates 34 and 36 are spanned over the areas between the three p-type doped regions 31, 32 and 33.

The first p-type transistor is used as a select transistor, and the polysilicon gate 34 (also referred as a select gate) of the first p-type transistor is connected to a select gate voltage $V_{SG}$. The p-type doped region 31 is connected to a source line voltage $V_{SL}$. The p-type doped region 32 is a combination of a p-type doped drain region of the first p-type transistor and a p-type doped region of the second p-type transistor. The second p-type transistor is a floating gate transistor. The polysilicon gate 36 (also referred as a floating gate) is disposed over the second p-type transistor. The p-type doped region 33 is connected to a bit line voltage $V_{BL}$. Moreover, the n-well region (NW) is connected to an n-well voltage $V_{NW}$.

As shown in FIGS. 1A and 1C, the conventional non-volatile memory further comprises an n-type transistor. The n-type transistor is composed of the floating gate 36 and an erase gate region 35. The n-type transistor is constructed in a p-well region (PW). An n-type doped region 38 is formed in the p-well region (PW). That is, the erase gate region 35 contains the p-well region (PW) and the n-type doped region 38.

As shown in FIG. 1A, the floating gate 36 is extended externally and located near the erase gate region 35. Consequently, the floating gate 36 is also the gate terminal of the n-type transistor. Moreover, the n-type doped region 38 may be considered as a combination of an n-type doped source region and an n-type doped drain region. The n-type doped region 38 is connected to an erase line voltage $V_{EL}$. In addition, the p-well region (PW) is connected to a p-well voltage $V_{PW}$. As shown in FIG. 1C, the erase gate region 35 and the n-well region (NW) are isolated from each other by an isolation structure 39. For example, the isolation structure 39 is a shallow trench isolation (STI) structure.

Generally, due to the arrangement of the erase gate region 35 in the conventional erasable programmable non-volatile memory, the hot carriers in the floating gate 36 can be ejected from the memory cell during the erase operation. However, since the erase gate region 35 needs to be constructed in the p-well region (PW), the conventional erasable programmable non-volatile memory contains the n-well region (NW) and the p-well region (PW). Under this circumstance, the size of the conventional erasable programmable non-volatile memory is larger.

SUMMARY OF THE INVENTION

The present invention provides a programmable non-volatile memory with a novel structure and a smaller size.

The present invention also provides a memory cell array of the programmable non-volatile memory.

An embodiment of the present invention provides a memory cell array of a programmable non-volatile memory. The memory cell array includes plural memory cells. A first memory cells of the plural memory cells includes a well region, a first doped region, a second doped region, a first gate structure, and a first storage structure. The first doped region and the second doped region are formed in the well region. The first doped region is connected with a first source line. The second doped region is connected with a first bit line. The first gate structure is formed over a first surface between the first doped region and the second doped region. The first gate structure is connected with a first word line. The first storage structure is formed over a second surface. The second surface is between the first surface and the second doped region. A first portion of the first storage structure is formed over a portion of the first gate structure. A second portion of the first storage structure is contact with the second surface. A third portion of the first storage structure is formed over an isolation structure.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A (prior art) is a schematic top view illustrating a memory cell of a conventional non-volatile memory;

FIG. 1B (prior art) is a schematic cross-sectional view illustrating the memory as shown in FIG. 1A and taken along a first direction (a1-a2);

FIG. 1C (prior art) is a schematic cross-sectional view illustrating the memory cell as shown in FIG. 1A and taken along a second direction (b1-b2);

FIG. 3A is a schematic top view illustrating a memory cell of a programmable non-volatile memory according to an embodiment of the present invention;

FIG. 3B is a schematic cross-sectional view illustrating the memory as shown in FIG. 3A and taken along a first direction (a1-a2);

FIG. 3C is a schematic cross-sectional view illustrating the memory cell as shown in FIG. 3A and taken along a second direction (b1-b2);

DETAILED DESCRIPTION OF PREFERRED EMBODIMENTS

FIGS. 2A to 2E schematically illustrate the steps of a method of manufacturing a programmable non-volatile memory which can be a one-time programmable (OTP) memory or an erasable multiple-time programmable (MTP) memory according to an embodiment of the present invention. For succinctness, only a memory cell of the programmable non-volatile memory is shown.

Figure 2E:
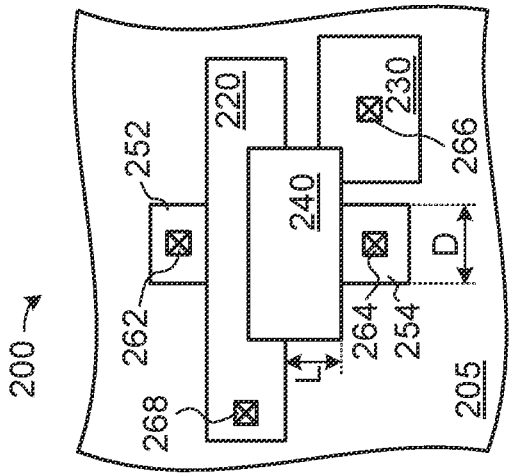
FIGS. 2A to 2E schematically illustrate the steps of a method of manufacturing a programmable non-volatile memory according to an embodiment of the present invention.
Figure 2C:
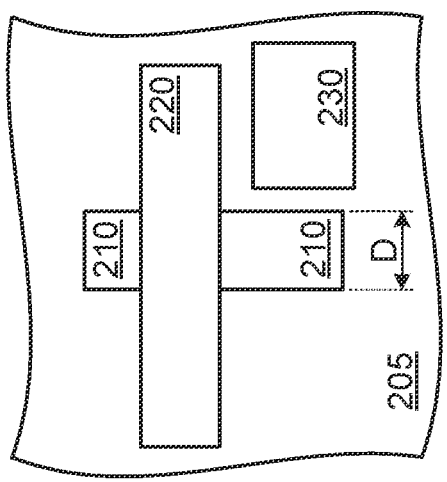
Figure 2D:
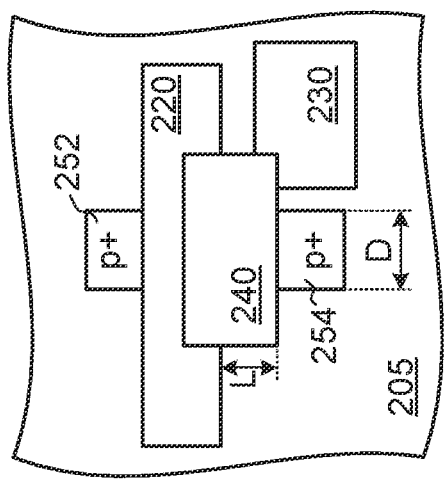
Figure 2A:
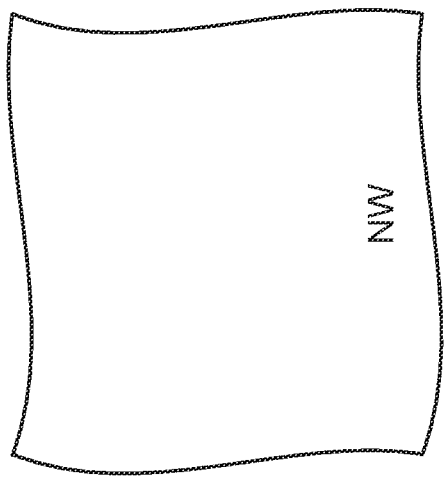

Firstly, as shown in FIG. 2A, an n-well region (NW) is formed in a semiconductor substrate. For example, the semiconductor substrate is a p-type semiconductor substrate (p-substrate).

Figure 2B:
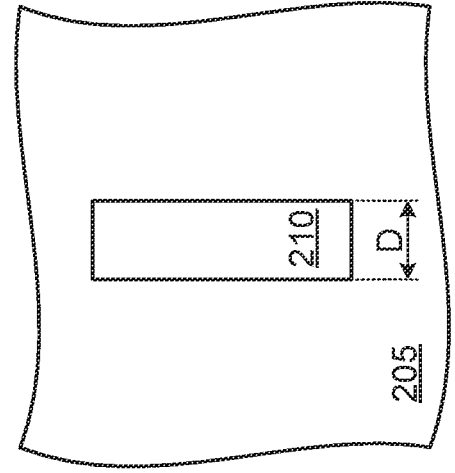

Then, a step of forming an isolation structure is performed. As shown in FIG. 2B, the n-well region (NW) has a rectangular zone 210 with a width D. Then, an isolation structure 205 is formed in the portion of the n-well region (NW) excluding the rectangular zone 210. That is, the portion of the n-well region (NW) corresponding to the rectangular zone 210 is retained. For example, the isolation structure 205 is a shallow trench isolation (STI) structure.

Then, a step of forming gate structures is performed. As shown in FIG. 2C, two gate structures 220 and 230 are formed. In some embodiments, since an OTP cell is not connected to an erase line, the step of forming the gate structure 230 for an erase operation can be omitted. The gate structure 220 is located over the surface of the isolation structure 205 and the surface of the rectangular zone 210. In some embodiments, in a MTP cell, the gate structure 230 is formed and is located over the isolation structure 205, but not located over the rectangular zone 210. Each of the gate structures 220 and 230 comprises a gate oxide layer, a gate layer and a sidewall insulator. The gate layer is a polysilicon gate layer. The sidewall insulator is a spacer.

Then, a step of forming a storage structure and an implanting step are performed. As shown in FIG. 2D, a storage structure 240 is formed to cover a portion of the isolation structure 205, a portion of the rectangular zone 210, a portion of the gate structure 220 and a portion of the gate structure 230. The storage structure 240 comprises a blocking layer and a charge storage layer.

After the storage structure 240 is formed, the portion of the rectangular zone 210 uncovered by the gate structure 220 and the storage structure 240 is subjected to ion implantation. Consequently, two p-type doped regions (p+) 252 and 254 are formed. The distance between a side of the gate structure 220 and the p-type doped region (p+) 254 is L.

After a step of forming contact lines is performed, the programmable non-volatile memory 200 is fabricated. As shown in FIG. 2E, plural contact holes are formed. In addition, metallic material is filled into the contact holes. Consequently, plural contact lines 262, 264, 266 and 268 are formed. The contact lines 262, 264, 266 and 268 are contacted with the p-type doped region 252, the p-type doped region 254, the gate structure 230 and the gate structure 220, respectively. The contact line 262 is used as a source line SL. The contact line 264 is used as a bit line BL. The contact line 266 is used as an erase line EL. The contact line 268 is used as a word line WL. In some embodiments, the order of the steps of manufacturing the programmable non-volatile memory can be changed. For example, the n-well region can be formed after the step of forming isolation structure 205 and the gate structures 220 and 230.

Please refer to FIGS. 3A, 3B and 3C. FIG. 3A is a schematic top view illustrating a memory cell of a programmable non-volatile memory according to an embodiment of the present invention. FIG. 3B is a schematic cross-sectional view illustrating the memory as shown in FIG. 3A and taken along a first direction (a1-a2). FIG. 3C is a schematic cross-sectional view illustrating the memory cell as shown in FIG. 3A and taken along a second direction (b1-b2).

As shown in FIGS. 3A, 3B and 3C, an n-well region (NW) is formed in a semiconductor substrate, and two p-type doped regions 352 and 354 are formed in the n-well region (NW). A contact line 362 (i.e., a source line SL) is connected with the p-type doped region 352. A contact line 364 (i.e., a bit line BL) is connected with the p-type doped region 354. A gate structure 320 is spanned over a first surface 353 of the n-well region (NW) between the p-type doped region 352 and the p-type doped region 354. A storage structure 340 is spanned over a second surface 355 of the n-well region (NW) between the p-type doped region 352 and the p-type doped region 354 and the second surface 355 is between the first surface 353 and the p-type doped region 354. The storage structure 340 is directly contacted with the second surface 355. The area of the second surface 355 is equal to L×D.

The gate structure 320 comprises a gate oxide layer 322, a gate layer 325 and a sidewall insulator 327. The gate oxide layer 322 is formed on the first surface 353 between the p-type doped region 352 and the p-type doped region 354. The gate layer 325 is formed on the gate oxide layer 322. The sidewall insulator 327 is arranged around the gate oxide layer 322 and the gate layer 325. A contact line 368 (i.e., the word line WL) is contacted with the gate layer 325.

The gate structure 330 is formed over the surface of the isolation structure 305. The gate structure 330 comprises a gate oxide layer 332, a gate layer 335 and a sidewall insulator 337. The gate oxide layer 332 is formed on the surface of the isolation structure 305. The gate layer 335 is formed on the gate oxide layer 332. The sidewall insulator 337 is arranged around the gate oxide layer 332 and the gate layer 335. A contact line 366 (i.e., the erase line EL) is contacted with the gate layer 335.

The storage structure 340 comprises a blocking layer 342 and a charge storage layer 345. The blocking layer 342 is formed over the second surface 355 between the p-type doped region 352 and the p-type doped region 354, a portion of the isolation structure 305, a portion of the sidewall insulator 327, a portion of the gate layer 325, a portion of the sidewall insulator 337 and a portion of the gate layer 335. The blocking layer 342 is directly contacted with the second surface 355. The charge storage layer 345 is formed on the blocking layer 342 by a self-aligned fabrication process. The charge storage layer 345 is formed conformally along a surface of the blocking layer 342, and, the charge storage layer 345 and the blocking layer 342 are directly contacted with each other.

Accordingly, a vertical projection of a first portion of the charge storage layer 345 on the first surface 353 overlaps with a vertical projection of the blocking layer 342 on the first surface 353, a vertical projection of the gate layer 325 on the first surface 353, and a vertical projection of the gate oxide layer 322 on the first surface 353.

Also, a vertical projection of a second portion of the charge storage layer 345 on the second surface 355 overlaps with a vertical projection of the blocking layer 342 on the second surface 355.

Furthermore, a vertical projection of a third portion of the charge storage layer 345 on the isolation structure 305 overlaps with a vertical projection of the blocking layer 342 on the isolation structure 305, a vertical projection of the gate layer 335 on the isolation structure 305, and a vertical projection of gate oxide layer 332 on the isolation structure 305.

In an embodiment, the blocking layer 342 is a salicide blocking layer. For example, the blocking layer 342 is a silicon dioxide (SiO2) layer, a stack structure comprising a silicon dioxide (SiO2) layer and a silicon nitride (SiNx) layer, or a stack structure comprising a silicon dioxide (SiO2) layer, a silicon nitride (SiNx) layer and a silicon oxynitride (SiON) layer. The charge storage layer 345 is a polysilicon charge storage layer.

In other words, a first portion of the storage structure 340 is formed over a portion of the gate structure 320, a second portion of the storage structure 340 is formed over the second surface 355 between the p-type doped region 352 and the p-type doped region 354, a third portion of the storage structure 340 is formed over a portion of the gate structure 330, and a fourth portion of the storage structure 340 is formed over a portion of the isolation structure 305.

FIGS. 4A to 4D schematically illustrate the bias voltages for the programmable non-volatile memory of the present invention while a program operation, an erase operation and a read operation are performed.

Figure 4A:
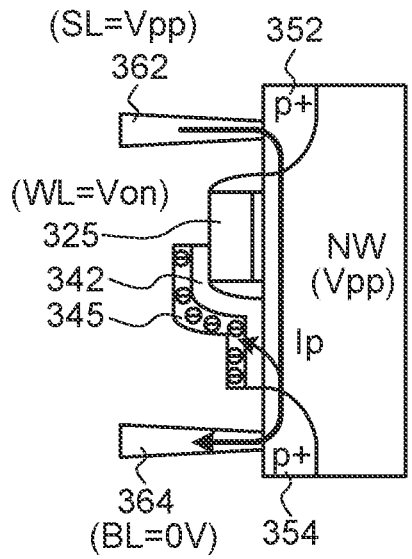
FIGS. 4A to 4D schematically illustrate the bias voltages for the programmable non-volatile memory of the present invention while a program operation, an erase operation and a read operation are performed.

Please refer to FIG. 4A. While the program operation is performed, an on voltage (Von) is provided to the word line WL, a ground voltage (0V) is provided to the bit line BL and the erase line EL, and a program voltage (Vpp) is provided to the N-well region (NW) and the source line SL. For example, the program voltage (Vpp) is in the range between +6V and +12V, and the on voltage (Von) is equal to 0V or Vpp/2. Consequently, a program current Ip flows from the source line SL to the bit line BL through the p-type doped region 352, a channel region under the first surface 353 and the second surface 355 and the p-type doped region 354. In addition, when hot carriers (e.g., holes) are transferred through the channel region under the second surface 355, a channel hot-hole-induced hot-electron (CHHIHE) injection effect occurs. Consequently, the hot carriers are injected into the charge storage layer 345 through the blocking layer 342. Generally, it takes about 50 µs to perform the program operation.

In case that the voltage provided to the erase line EL is gradually increased from the ground voltage (0V) to Vpp/2 during the program operation, the amount of hot carriers injected into the charge storage layer 345 is increased.

Figure 4B:
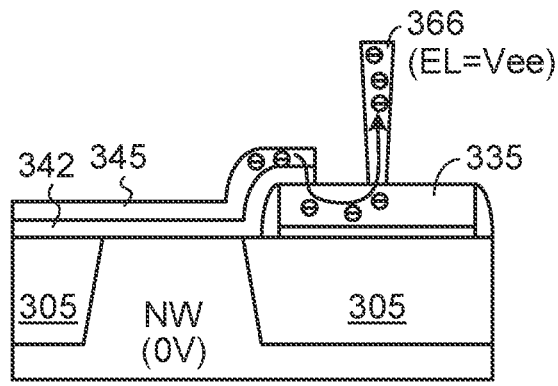

Please refer to FIG. 4B. While the erase operation is performed, the ground voltage (0V) is provided to the word line WL, the bit line BL, the source line SL and the N-well region (NW), and an erase voltage (Vee) is provided to the erase line EL. For example, the erase voltage (Vee) is in the range between +6.5V and +20V. When the erase line EL receives the erase voltage (Vee), a Fowler-Nordheim tunneling effect occurs. Consequently, the hot carriers stored in the charge storage layer 345 are ejected from the charge storage layer 345, transferred to the erase line EL through the blocking layer 342 and the gate layer 355, and departed from the memory cell. After the erase operation is completed, no hot carriers are stored in the charge storage layer 345. Generally, it takes about 200 ms to perform the erase operation.

Figure 4C:
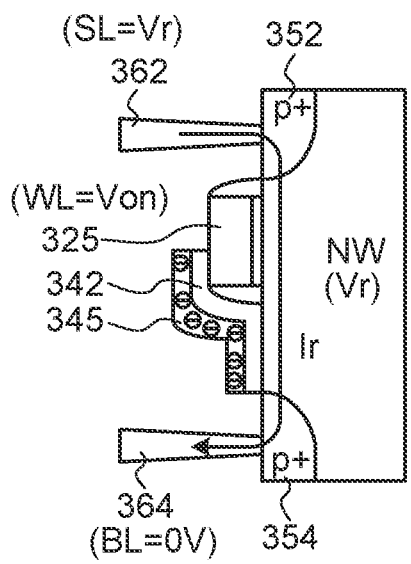
Figure 4D:
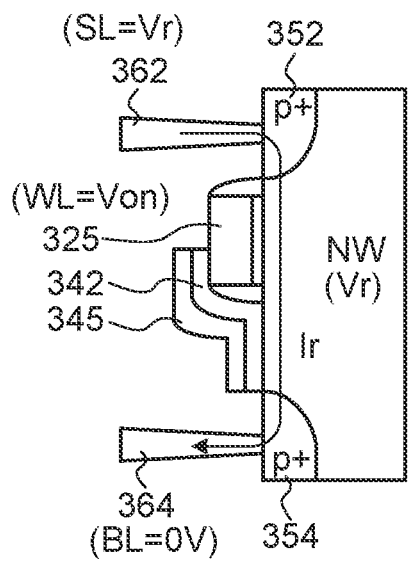

Please refer to FIGS. 4C and 4D. While the read operation is performed, the on voltage (Von) is provided to the word line WL, the ground voltage (0V) is provided to the bit line BL, a read voltage (Vr) is provided to the source line SL and the N-well region (NW), and the ground voltage (0V) is provided to the erase line EL. For example, the read voltage (Vr) is +1.8V~+3.0V, and the on voltage (Von) is 0V. Depending on the situation of whether the hot carriers are stored in the charge storage layer 345, different magnitudes of the read current are acquired. That is, during the read operation, the storage state of the memory cell can be realized according to the read current.

As shown in FIG. 4C, the read current Ir flows from the source line SL to the bit line BL through the p-type doped region 352, the channel region under the first surface 353 and the second surface 355 and the p-type doped region 354. Since hot carriers are stored in the charge storage layer 345, the magnitude of the read current Ir is larger (e.g., higher than 5 µA).

Please refer to FIG. 4D. Since hot carriers are not stored in the charge storage layer 345, the magnitude of the read current Ir is very small (e.g., about 0.1 µA).

In other words, the storage state of the memory cell can be judged according to the read current flowing through the bit line BL during the read operation. For example, a sensing circuit (not shown) of the programmable non-volatile memory provides a reference current (e.g., 2 µA). According to the result of comparing the read current with the reference current, the sensing circuit determines the storage state of the memory cell.

If the read current is higher than the reference current, the sensing circuit judges that the memory cell is in a first storage state (e.g., the "0" state). Whereas, if the read current is lower than the reference current, the sensing circuit judges that the memory cell is in a second storage state (e.g., the "1" state). Consequently, the memory cell as shown in FIG. 4C is determined as the first storage state, and the memory cell as shown in FIG. 4D is determined as the second storage state.

It is noted that the values of the bias voltages are not restricted. That is, the bias voltages for performing the program operation, the erase operation and the read operation may be varied according to the practical requirements. Optionally, a soft program operation is performed on the memory cell. After the erase operation is completed or before the program operation is performed, few hot carriers are injected. It takes about 50 ms to perform the soft program operation. While the soft program operation is performed, a program voltage (Vpp) is provided to the word line WL, the source line SL and the N-well region (NW), a ground voltage (0V) is provided to the bit line BL, and a bias voltage (Vb) is provided to the erase line EL. For example, the program voltage (Vpp) is in the range between +6V and +12V, and the bias voltage (Vb) is equal to Vpp/2.

Figure 5:
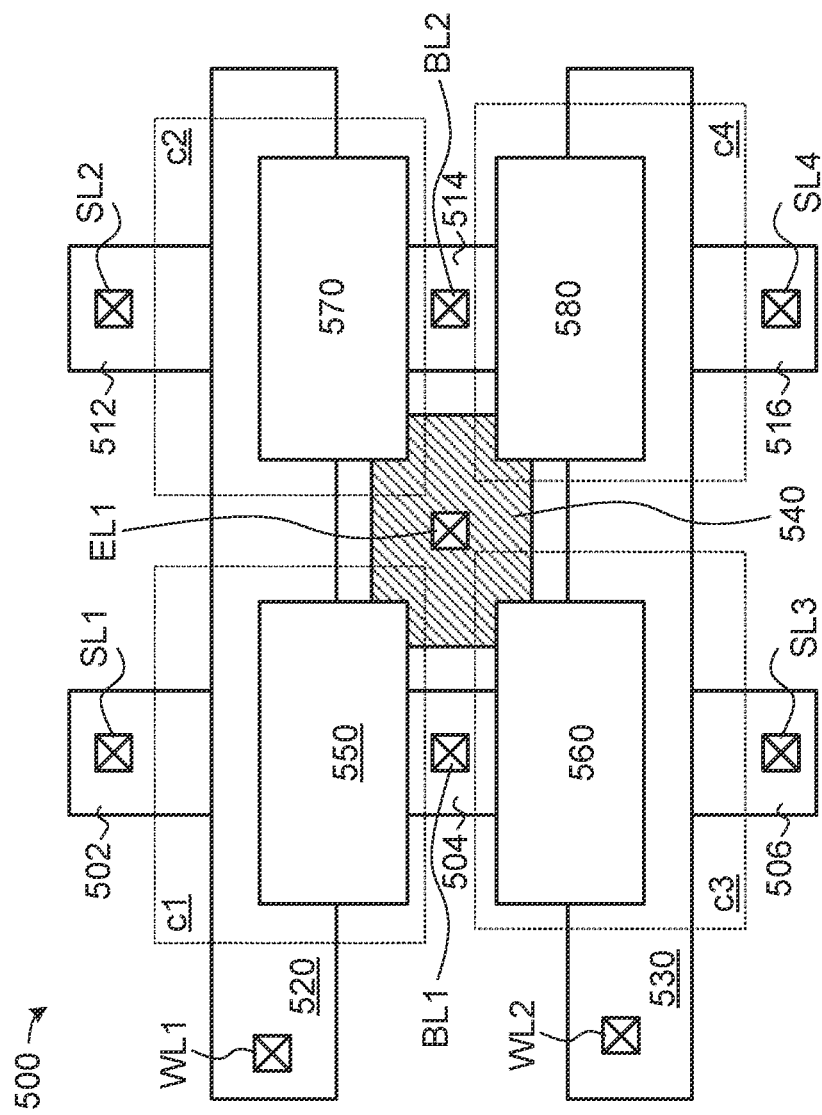
FIG. 5 is a schematic top view illustrating a memory cell array of a programmable non-volatile memory according to an embodiment of the present invention.

The present invention further comprises a memory cell array. The memory cell array comprises plural memory cells. FIG. 5 is a schematic top view illustrating a memory cell array of a programmable non-volatile memory according to an embodiment of the present invention. The memory cell array 500 comprises four memory cells c1~c4. The structure of each of the memory cells c1~c4 is similar to the structure of FIG. 3A.

The memory cells c1 comprises two doped regions 502, 504, two gate structures 520, 540, and a storage structure 550. The doped region 502 is connected with a source line SL1. The doped region 504 is connected with a bit line BL1. The gate structure 520 is connected with a word line WL1. The gate structure 540 is connected with an erase line EL1.

The memory cells c2 comprises two doped regions 512, 514, two gate structures 520, 540, and a storage structure 570. The doped region 512 is connected with a source line SL2 parallel to the source line SL1. The doped region 514 is connected with a bit line BL2. The gate structure 520 is connected with the word line WL1. The gate structure 540 is connected with the erase line EL1.

The memory cells c3 comprises two doped regions 506, 504, two gate structures 530, 540, and a storage structure 560. The doped region 506 is connected with a source line SL3 connected with the source line SL1. The doped region 504 is connected with the bit line BL1. The gate structure 530 is connected with a word line WL2. The gate structure 540 is connected with the erase line EL1.

The memory cells c4 comprises two doped regions 516, 514, two gate structures 530, 540, and a storage structure 580. The doped region 516 is connected with a source line SL4 parallel to the source line SL3 and the source line SL4 is connected with the source line SL2. The doped region 514 is connected with the bit line BL2. The gate structure 530 is connected with the word line WL2. The gate structure 540 is connected with the erase line EL1.

From the above descriptions, the present invention provides a programmable non-volatile memory with a novel structure and provides an associated memory cell array. The programmable non-volatile memory is constructed in a single well region. Consequently, the size of the memory cell can be reduced.

In the above embodiments, the programmable non-volatile memory is constructed in the N-well region (NW). It is noted that numerous modifications and alterations may be made while retaining the teachings of the invention. For example, the N-well region (NW) in the memory cell as shown in FIG. 3B may be replaced with a p-well region (PW), and the two p-type doped regions 352 and 354 are replaced with n-type doped regions.

Furthermore, in some embodiments, the memory cell array maybe modified to an OTP memory cell array if the gate structure 540 and the erase line EL1 shown on FIG. 5 are not fabricated. Thus, the four memory cells c1~c4 shown on FIG. 5 are modified to OTP memory cells.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory cell array of a programmable non-volatile memory, comprising plural memory cells, a first memory cells of the plural memory cells comprising:
   a well region;
   a first doped region and a second doped region formed in the well region, wherein the first doped region is connected with a first source line, and the second doped region is connected with a first bit line;
   a first gate structure formed over a first surface between the first doped region and the second doped region, wherein the first gate structure is connected with a first word line; and
   a first storage structure formed over a second surface, wherein the second surface is between the first surface and the second doped region;
   wherein a first portion of the first storage structure is formed over a portion of the first gate structure, a second portion of the first storage structure is contacted with the second surface, and a third portion of the first storage structure is formed over an isolation structure.

2. The memory cell array as claimed in claim 1, further comprising a second gate structure formed over a surface of the isolation structure, wherein the second gate structure is connected with an erase line, and a fourth portion of the first storage structure is formed over a first portion of the second gate structure.

3. The memory cell array as claimed in claim 2, wherein a second memory cell of the plural memory cells comprises:
   a third doped region and a fourth doped region formed in the well region, wherein the third doped region is connected with a second source line, and the fourth doped region is connected with a second bit line;
   the first gate structure formed over a third surface between the third doped region and the fourth doped region;
   a second storage structure formed over a fourth surface, wherein the fourth surface is between the third surface and the fourth doped region; and
   the second gate structure formed over the surface of the isolation structure,
   wherein a first portion of the second storage structure is formed over another portion of the first gate structure, a second portion of the second storage structure is contacted with the fourth surface, a third portion of the second storage structure is formed over the isolation structure, and a fourth portion of the second storage structure is formed over a second portion of the second gate structure.

4. The memory cell array as claimed in claim 2, wherein the first storage structure comprises a blocking layer and a charge storage layer, wherein the blocking layer is formed over the portion of the first gate structure, the second surface, a portion of the isolation structure and the first portion of the second gate structure, and the charge storage layer is formed over the blocking layer.

5. The memory cell array as claimed in claim 4, wherein the first gate structure comprises a first gate oxide layer, a first gate layer and a first sidewall insulator, wherein the first gate oxide layer is formed over the first surface, the first gate layer is formed on the first gate oxide layer, the first sidewall insulator is arranged around the first gate oxide layer and the first gate layer, and the first word line is connected with the first gate layer, wherein the second gate structure comprises a second gate oxide layer, a second gate layer and a second sidewall insulator, wherein the second gate oxide layer is formed over the surface of the isolation structure, the second gate layer is formed on the second gate oxide layer, the second sidewall insulator is arranged around the second gate oxide layer and the second gate layer, and the erase line is connected with the second gate layer.

6. The memory cell array as claimed in claim 5, wherein a vertical projection of a first portion of the charge storage layer on the first surface overlaps with a vertical projection of the blocking layer on the first surface, a vertical projection of the first gate layer on the first surface, and a vertical projection of the first gate oxide layer on the first surface, and wherein a vertical projection of a second portion of the charge storage layer on the second surface overlaps with a vertical projection of the blocking layer on the second surface.

7. The memory cell array as claimed in claim 6, wherein a vertical projection of a third portion of the charge storage layer on the isolation structure overlaps with a vertical projection of the blocking layer on the isolation structure, a vertical projection of the second gate layer on the isolation structure, and a vertical projection of second gate oxide layer on the isolation structure.

8. The memory cell array as claimed in claim 4, wherein the blocking layer is a salicide blocking layer.

9. The memory cell array as claimed in claim 8, wherein the salicide blocking layer is a silicon dioxide layer, a stack structure comprising a silicon dioxide layer and a silicon nitride layer, or a stack structure comprising a silicon dioxide layer, a silicon nitride layer and a silicon oxynitride layer.

10. The memory cell array as claimed in claim 4, wherein the charge storage layer is a polysilicon charge storage layer.

11. The memory cell array as claimed in claim 1, wherein the first storage structure comprises a blocking layer and a charge storage layer, wherein the blocking layer is formed over the portion of the first gate structure, the second surface, and a portion of the isolation structure, and the charge storage layer is formed over the blocking layer.

12. The memory cell array as claimed in claim 11, wherein the charge storage layer is formed conformally along a surface of the blocking layer.

13. The memory cell array as claimed in claim 1, wherein the first gate structure comprises a first gate oxide layer, a first gate layer and a first sidewall insulator, wherein the first gate oxide layer is formed over the first surface, the first gate layer is formed on the first gate oxide layer, the first sidewall insulator is arranged around the first gate oxide layer and the first gate layer, and the first word line is connected with the first gate layer.

14. The memory cell array as claimed in claim 1, wherein during a program operation, an on voltage is provided to the first word line, a ground voltage is provided to the first bit line and the erase line, and a program voltage is provided to the well region and the first source line, wherein during the program operation, a program current flows from the first source line to the first bit line through the first doped region, a channel region under the first surface and the second surface and the second doped region, so that plural hot carriers are injected into a charge storage layer of the first storage structure.

15. The memory cell array as claimed in claim 14, wherein during an erase operation, the ground voltage is provided to the first word line, the first bit line, the well region and the first source line, and an erase voltage is provided to the erase line, so that the hot carriers are ejected from the charge storage layer to the erase line through a gate layer of the second gate structure.

* * * * *